United States Patent
Lin

(10) Patent No.: US 6,576,384 B1
(45) Date of Patent: *Jun. 10, 2003

(54) MASK IMAGE SCANNING EXPOSURE METHOD

(75) Inventor: John Chin-Hsiang Lin, Kaohsung (TW)

(73) Assignee: Vanguard International Semiconductor Corporation, Hsin-Chu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 504 days.

(21) Appl. No.: 09/174,617

(22) Filed: Oct. 19, 1998

(51) Int. Cl.⁷ .................................................. G03F 9/00
(52) U.S. Cl. ............................................ 430/30; 430/5
(58) Field of Search .............................. 430/5, 311, 30; 250/492

(56) References Cited

U.S. PATENT DOCUMENTS

| | | | |
|---|---|---|---|
| 4,809,341 A | 2/1989 | Matsui et al. | 382/8 |
| 5,028,939 A | 7/1991 | Hornbeck et al. | 346/160 |
| 5,063,602 A | 11/1991 | Peppers et al. | 382/32 |
| 5,260,154 A | 11/1993 | Forrest | 430/30 |
| 5,527,645 A | * 6/1996 | Pati et al. | 430/5 |
| 5,539,568 A | 7/1996 | Lin et al. | 359/285 |
| 5,691,541 A | * 11/1997 | Ceglio et al. | 250/492 |
| 5,998,069 A | * 12/1999 | Cutter et al. | 430/5 |

OTHER PUBLICATIONS

Pfauler et al. "High–Throughput Optical Direct Write Lithography" Solid State Technology (Jun. 1997), p 175–176, 178, 180, 182.

Zwart et al. "Performance of Step and Scan System for DUV Lithography", SPIE, vol. 3051, p 817–833, 835, 1997.

Kazuaki Suzuki et al. "KrF Step and Scan Exposure System Using Higher NA Projection Lens", SPIE vol. 2726, p 767–779, 1996.

Martain van den Brink et al. "Step and Scan and Step and Repeat, a Technology Comparison", SPIE, vol. 2726, p 734–753, 1996.

Cote et al. "Microscan™ III–Performance of a Third Generation. Catadioptric Step and Scan Lithographic Tool", SPIE, vol. 3051, p 806, 1997.

* cited by examiner

*Primary Examiner*—Mark F. Huff
*Assistant Examiner*—Saleha R. Mohamedulla
(74) *Attorney, Agent, or Firm*—George O. Saile; Stephen B. Ackerman; Graham S. Jones, II

(57) ABSTRACT

A dynamic mask exposure method and system includes a support for a workpiece, a source of a beam of exposure radiation, and a transmissive dynamic mask with orthogonally arranged matrices of actuator lines and binary pixel units which are opaque or transparent as a function of control inputs to the actuator lines, the transmissive dynamic mask having a top surface and a bottom surface. A control system is connected to supply pixel control signals to the actuator lines of the transmissive dynamic mask to form a scanning pattern of transparent regions and opaque regions which scans across the dynamic mask. The beam is directed down onto the top surface of the mask and through a slit in a diaphragm onto the workpiece. The beam passes through the transparent regions and projects a pattern from the mask onto the support where the workpiece.

8 Claims, 4 Drawing Sheets

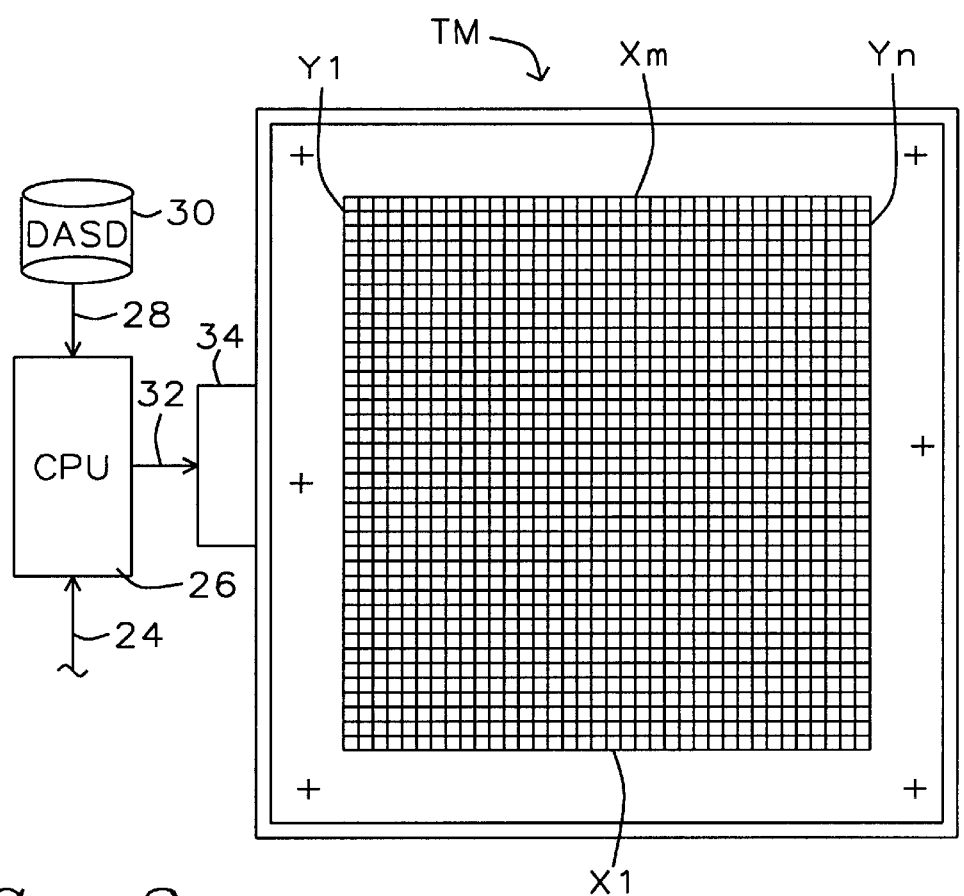
FIG. 2
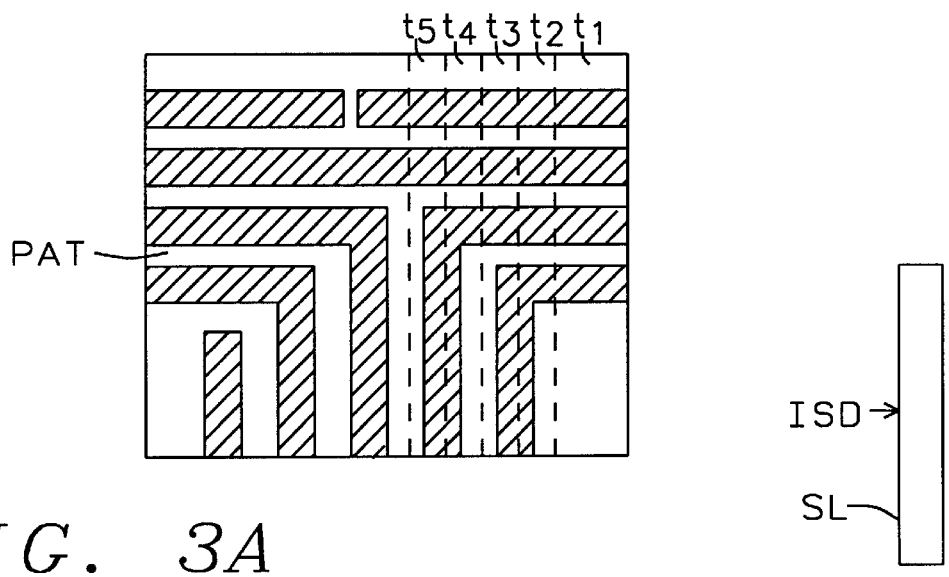
FIG. 3A
FIG. 3B

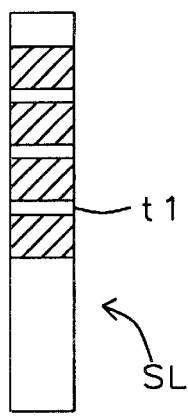 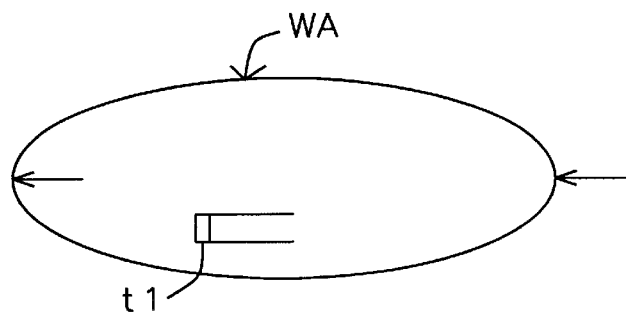
*FIG. 4A*      *FIG. 4B*
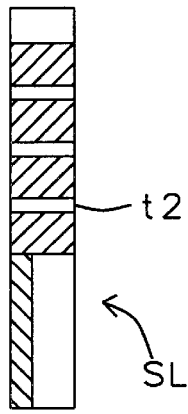 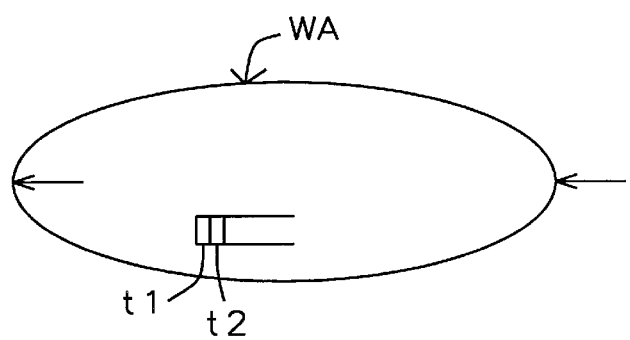
*FIG. 4C*      *FIG. 4D*
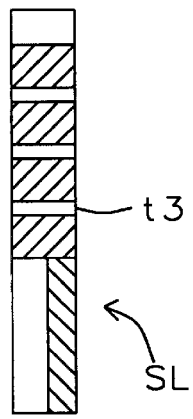 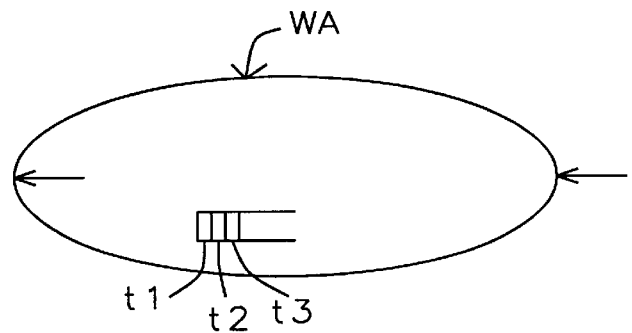
*FIG. 4E*      *FIG. 4F*

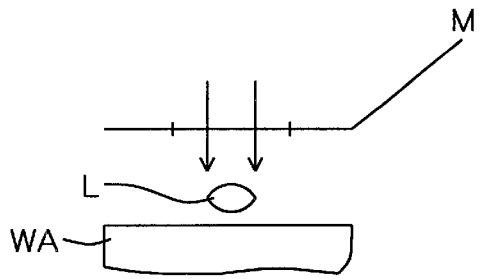
*FIG. 5A – Prior Art*
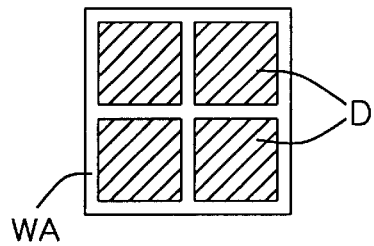
*FIG. 5B – Prior Art*
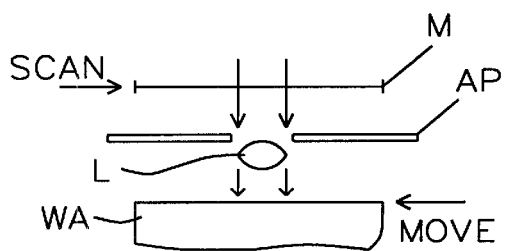
*FIG. 5C – Prior Art*
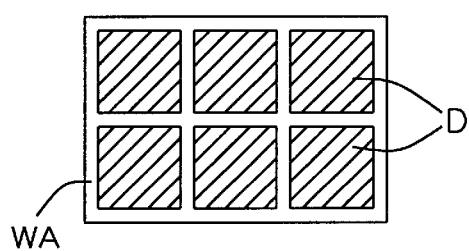
*FIG. 5D – Prior Art*
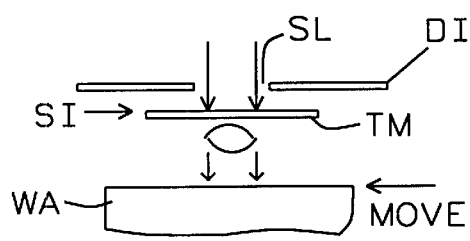
*FIG. 5E*
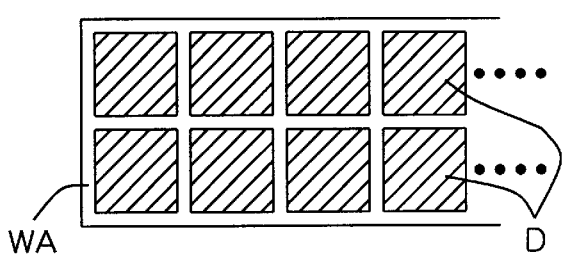
*FIG. 5F*

MASK IMAGE SCANNING EXPOSURE METHOD

CROSS-REFERENCE TO RELATED APPLICATIONS

This application is related to my commonly assigned applications Ser. No. 09/174,616 filed Oct. 19, 1998 and Ser. No. 09/156,057, filed Sep. 17, 1998.

BACKGROUND OF THE INVENTION

1. Field of the Invention

This invention relates to scanning exposure systems and more particularly to improved methods and apparatus for exposing a workpiece to radiation defining a pattern.

2. Description of Related Art

Disadvantages of the current art are as follows:

a) The field size of a stepper and/or a scanner is limited by the mask size and the lens size.

b) During the manufacture of simply one device, many masks for the various layers of the device are required. Pfauler et al. "High-Throughput Optical Direct Write Lithography", Solid State Technology (June 1997), pp. 175–176, 178, 180, 182 describes a direct write lithography system using a programmable phase-modulated spatial light modulator (SLM) system in which the image is reflected from the SLM onto a semiconductor wafer. The spatial light modulator comprises an array of rectangular electrodes with a reflective, deformable viscoelastic layer on top. The SLM serves as a plane mirror in an optical system.

Zwart et al., "Performance of Step and Scan System for DUV Lithography", SPIE, Vol. 3051, pp. 817–833 and 835 discusses steppers.

Kazuaki Suzuki et al, "KrF Step and Scan Exposure System Using Higher NA Projection Lens", SPIE Vol. 2726 pp. 767–779 discusses step and scan lens performance.

Martain van den Brink, et al, "Step and Scan and Step and Repeat, a Technology Comparison", SPIE, Vol. 2726, pp. 734–753 discuses lithography systems.

See Cote et al. "Micrascan™ III-performance of a Third Generation, Catadioptric Step and Scan Lithographic Tool" SPIE, Vol. 3051, p. 806

U.S. Pat. No. 5,028,939 of Hornbeck for "Spatial Light Modulator System" shows a SLM.

U.S. Pat. No. 5,063,602 of Peppers for "Image Correlation Calculation Apparatus" shows an image correlation calculation apparatus.

U.S. Pat. No. 5,260,154 of Forrest for "Evaluating Photolithographic Exposures" shows a method of evaluating line-width exposures using a film evaluated with a computer.

U.S. Pat. No. 5,539,568 of Lin for "Method of Exposing a Light Sensitive Material" and U.S. Pat. No. 4,809,341 of Matsui for "Test method and apparatus for a Reticle or Mask Pattern used in Semiconductor Device Fabrication" show a methods of photomask testing.

SUMMARY OF THE INVENTION

In accordance with the present invention, a "Mask Image Scanning" (MIS) exposure system is provided. The pattern images in the mask middle part—a slit shifts in a first direction and simultaneously, a workpiece comprising a photoresist coated silicon semiconductor wafer is shifted synchronously in the opposite direction during the period of exposure.

In accordance with this invention, a dynamic mask exposure system and method comprises a scanning support for a workpiece, a source of a beam of exposure radiation, and a transmissive dynamic mask with orthogonally arranged matrices of actuator lines and binary pixel units which are opaque or transparent as a function of control inputs to the actuator lines, the dynamic mask having a top surface and a bottom surface. A control system connected to supply scanning pixel control signals to the actuator lines of a dynamic mask to form a scanning pattern of opaque and transmissive regions. The beam is directed down onto the top surface of the mask. The beam passing through the transparent pixels and projecting a pattern from the mask onto the support where the workpiece is to be located. A diaphragm is provided with a slit therethrough between the source of the beam and the workpiece. The image projected by transmitting the beam through transparent pixel units in the opposite direction from the scanning support and projecting a scanning pattern from the mask onto the support where the workpiece is to be located. The workpiece is driven in a first direction transverse to the beam by the scanning support, and the pixel control signals scan across the transmissive dynamic mask in a direction opposite from the first direction.

Preferably, the control system comprises a computer and a direct access storage device for storing patterning data, and the transmissive dynamic mask comprises a transmissive spatial light modulator.

Preferably, the source of the beam of exposure radiation comprises a collimated beam of light, the source of the beam of exposure radiation comprises a collimated beam of light provided by a set of condenser lenses projecting the collimated beam of light onto the top surface of the mask, and a set of projection lenses projecting the focussing the pattern from the mask onto the support from the bottom surface of the mask.

Preferably, the transmissive dynamic mask comprises a transmissive spatial light modulator.

BRIEF DESCRIPTION OF THE DRAWINGS

The foregoing and other aspects and advantages of this invention are explained and described below with reference to the accompanying drawings, in which:

FIG. 2 shows a plan view of the transmissive universal dynamic mask TM shown in consisting of a x, y matrix array of small pixels which preferably comprises a spatial light modulator (SLM).

FIG. 3A shows an overall pattern, a portion of which will appears above a mask slit shown in FIG. 3B at time t1.

FIG. 3B shows the slit in the diaphragm for providing a narrow, scannable, exposure pattern.

FIGS. 4A, 4C and 4E show the image in the mask at times t1, t2 and t3 respectively of the transmissive mask with the pattern seen in FIG. 3A with the pattern which exists in mask at time t1. The shifting of the pattern appearing on the mask is seen when looking at FIGS. 4C and 4E which show the image in the mask at times t2 and t3 respectively and comparing those image to the image at time t1 in FIG. 4A.

FIG. 4A shows the image pattern which appears in the mask slit at time t1.

FIG. 4B shows the pattern projected upon a wafer at time t1 as the wafer begins to move from the right to the left. The image scanning direction of the images projected through the slit is from left to right.

FIG. 4C shows the image pattern which appears in the mask slit at time t2.

FIG. 4D shows the pattern projected upon a wafer at time t2 as the wafer moves along from right to left.

FIG. 4E shows the image pattern which appears in the mask slit at time t3.

FIG. 4F shows a pattern projected upon a wafer at time t3 as the wafer moves along, even farther from right to left.

FIG. 5A shows the use of a prior art conventional mask in a conventional stepper system with a lens to expose a wafer image in one shot (for example a 4×16M DRAM).

FIG. 5B shows a prior art plan view of the result of the exposure upon a wafer in FIG. 5A.

FIG. 5C shows the use of a prior art step and scan system with an aperture below a mask which is scanning from left to right at the same time that the workpiece wafer is moving from right to left.

FIG. 5D shows that with the same lens with one shot can expose more dies depending upon mask size, which shows a plan view of the result of the exposure upon the wafer with the system of FIG. 5C.

FIG. 5E shows the use of a system in accordance with this invention with a scan which distance can be prolonged to last for a much longer duration. There is no limit to the size of the mask since it is the scanning image which is scanning, not the mask.

FIG. 5F shows the multiple dies produced with the system and method of FIG. 5E.

DESCRIPTION OF THE PREFERRED EMBODIMENT

Figure 1A:
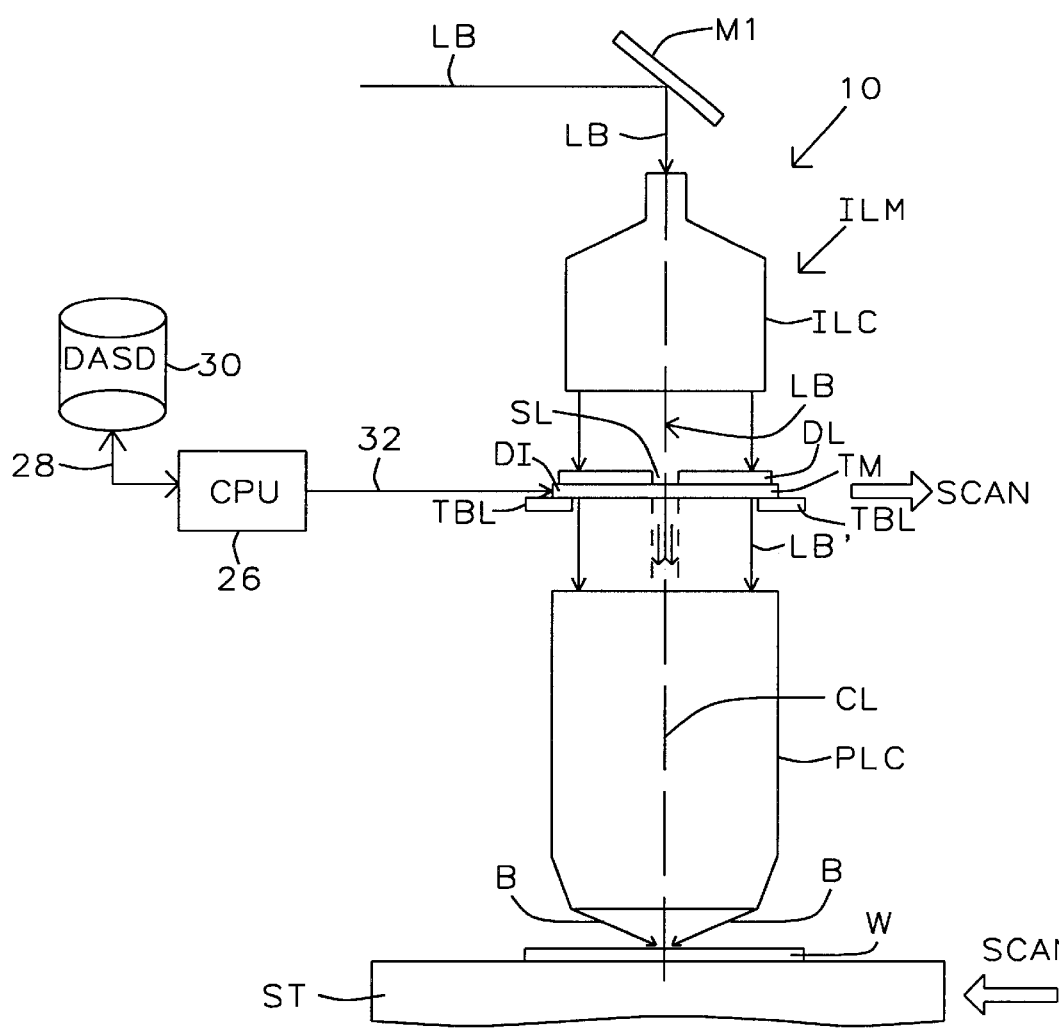
FIG. 1A shows a schematic elevational section of a system for exposing a workpiece with a computer controlled pattern of light projected through a transmissive universal dynamic mask and a diaphragm with scanning slit in accordance with this invention.

FIG. 1A shows a schematic elevational section of a system 10 for exposing a workpiece W supported by a stage ST with a pattern of light projected through a transmissive universal dynamic mask TM in accordance with this invention. FIG. 1A is a schematic elevational section of a system 10 taken along the x (horizontal from left to right) and z (vertical) axes (in an x, y, z coordinate system) of a "Mask Image Scanning" (MIS) exposure system 10 in accordance with this invention. Above the workpiece W, a radiation transmissive universal dynamic mask TM is supported in a fixed position on a table TBL which is fixed in position. Affixed on top of the mask TM is a diaphragm DI with a narrow slit SL having its length extending along the y axis (back into the page in FIG. 1A).

Figure 1B:
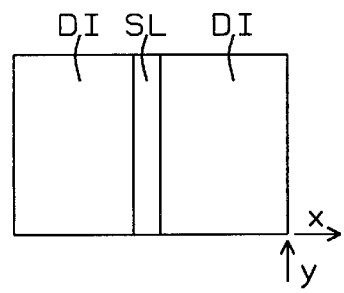
FIG. 1B shows a plan view of the diaphragm with a scanning slit of FIG. 1A.

FIG. 1B is a plan view of the diaphragm DI showing the transparent vertical slit SL which is narrow along the x axis and extending farther along the y axis. On either side of the slit SL, the diaphragm DI is opaque. That blocks the light beam LB from reaching the mask TM except for light which passes through the slit SL. The system 10 exposes the workpiece W supported by a stage ST with a pattern of light projected through transparent portions of the mask TM. The mask TM and the slit SL remain in fixed position, as the image is scanned electronically across the mask TM under the control of the computer 26, reading the image shown in FIG. 1C to produce an effective image scan of the image in an image scan direction from side to side, i.e. from left to right, as indicated in FIG. 1C.

Figure 1C:
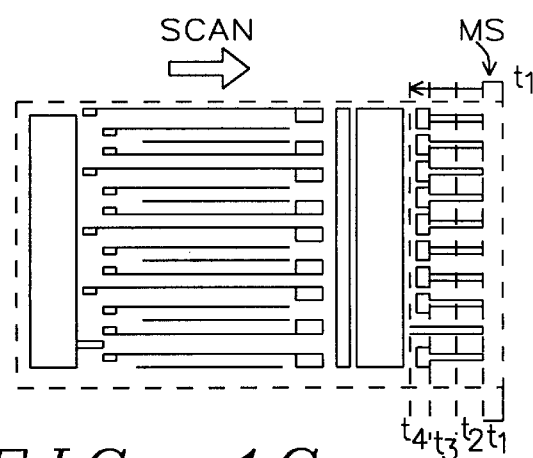
FIG. 1C shows a plan view of a pattern provided to transmissive universal dynamic mask in FIG. 1A in response to signals provided by the computer from data in a DASD.

FIG. 1C shows a plan view of a pattern provided to transmissive universal dynamic mask TM in FIG. 1A in response to signals provided by computer 26 from data in DASD 30. The pattern of the device to be produced on workpiece W is shown with a series of parallel strips for projection through slit SL at consecutive exposure times t1, t2, t3, and t4 as indicated in FIG. 1C. At time t1, the strip is all white or transparent. At times t2, and t3, there are alternating identical opaque and transparent stripes. At time t4, the pattern is more complex with a vertical strip of transparency on the left and the vertical opaque tips on the ends of most of the alternating stripes.

At the same time in a lateral scan of stage ST, the workpiece W is scanned from in a workpiece scan direction from side to side, e.g. from right to left, and workpiece W is exposed through the slit SL to light projected through those pixels in the universal dynamic transmissive mask TM which are transparent. The slit SL in a diaphragm DI while stationary exposes an image as the image, not the mask, is scanned electronically from side to side in the image scan direction across the fixed mask TM exposing the workpiece W to light from the collimated beam LB through the fixed slit SL above the mask TM.

At any given time, a portion of beam LB passes through the slit SL and the mask TM where mask TM is transmissive, thereby producing a projection of a light beam LB' which has passed through the mask TM and the slit SL onto the portions of the workpiece W below the currently transparent portions of the mask TM.

Mask TM comprises a transmissive Spatial Light Modulator (SLM) which varies from being opaque to being transmissive for each pixel as a function of time. The opacity and transmissivity varies for each pixel in accordance with the signals provided from CPU 26 on line 32 to the mask TM. Mask TM is actuated by signals on x and y matrix lines whereby binary "1" and "0" signals provide opaque or transmissive regions in a matrix through which beam LB is projected. Mask TM is supported upon table TBL which has a hollow opening below the space scanned by the slit SL through which the beam LB' passes through the mask TM. The CPU 26 (computer) employs x, y matrix patterning data stored in direct access storage device (DASD) 30. CPU 26 retrieves stored data from the DASD 30 on line 28 and also supplies new data to DASD 30, as will be well understood by those skilled in the art.

Mask TM is energized by x, y matrices as illustrated by FIG. 2 which is a plan view of the mask TM and the control system including computer 26 which energizes the pixel elements of the mask TM. Thus workpiece W is exposed to a pattern provided by mask TM under control of computer 26 but by a scanning process as the the scanning image moves from side to side across SLM mask TM relative to the stationary slit SL in the opposite direction from the workpiece scan, e.g. from left to right.

In FIG. 1A, a light source beam LB is directed at a mirror M1 which reflects the light source beam LB down along a path parallel to the z axis into an illuminator lens module ILM to condenser lenses to produce a collimated beam (i.e. parallel beam) of light rays directed towards a diaphragm DI with a slit SL (extending back into the page in FIG. 1A) through which a portion LB' of the beam LB passes.

Referring to FIG. 1B, which shows the plan view of diaphragm DI, the slit SL is seen as a vertical slit extending parallel to the y axis of the stage ST. The diaphragm DI rests upon mask TM. The diaphragm DI and mask TM are affixed in position and do not reciprocate from left to right along the x axis. But the image presented in the slit proceeds in the image scan direction, e.g. from right to left, which is the opposite direction from the workpiece scan direction as indicated by the arrow as successive portions of the pattern of FIG. 1C are seen through the slit SL exposing successive pattern portions by changing the patterns on the universal dynamic transmissive mask TM located below the diaphragm DI to project different patterns of light through the slit SL. That light comprises collimated light beam LB which comes from the illuminator lens module ILM which floods the upper surface of the diaphragm DI.

FIG. 2 shows a plan view of the transmissive universal dynamic mask TM consisting of an x, y matrix array of small pixels which is preferably a Spatial Light Modulator (SLM). Every pixel can be switched ON/OFF ("0"/"1") by a Central Processing Unit (CPU) of computer 26 to form a designed device pattern from a computer data base stored on data storage device 30 such as a disk drive or other Direct Access Storage Device (DASD). The computer 26 is connected by conventional interconnection block 34 to the mask TM which comprises an array of actuator lines extending along rectilinear x and y coordinate axes. The x lines X1 to Xm extend horizontally parallel to the x axis and the y lines Y1 to Yn extend vertically parallel to the y axis, where "m" and "n" are positive integers equal to the number of parallel actuator lines in the array with m horizontal lines X1 . . . Xm and n vertical lines Y1 . . . Yn. Since the slit SL is narrow, the number of from Y1 to Yn may be far less than the number of lines from X1 to Xm.

Patterning images are generated under control of a computer CPU 26 which actuates elements of the universal dynamic transmissive mask TM located on table TBL which is located in middle below diaphragm DI. Slit SL receives image patterns passing through the mask TM and slit as the image patterns shift from side to side, e.g. from left to right, in the image scan direction as the workpiece W is shifted simultaneously and synchronously, in the opposite workpiece scan direction e.g. from the right to the left. For example, the workpiece W comprises a photoresist coated silicon semiconductor wafer scanned by motion of stage ST to the left and then back to the right by motion of stage ST upon which workpiece W is supported during the period of exposure.

The patterning images comprise portions of beam LB' which pass through both the slit SL and the mask TM through the projection lens column PLC which receives the beam LB' after it passes through the mask TM. The projection lens column PLC projects the image through beam LB' of light rays directed along centerline CL towards the workpiece (wafer). Lens PL2 focuses the beam LB' into a slit beam B which exposes the surface of the workpiece W with the pattern projected from the slit SL above.

With this "Mask Image Scanning" (MIS) exposure system pattern images in the mask TM ("middle part") are formed as the images presented to the slit SL shift in a first direction while at the same time the photoresist coated silicon semiconductor wafer workpiece W is shifting in the opposite direction during the period of exposure.

The present invention is related to my copending United States patent application for a "Universal Dynamic Transmissive Mask" UDTM, Ser. No. 09/156,057, filed Sep. 17, 1998, which is commonly assigned, that shows a mask fabrication system comprising a universal dynamic transmissive mask (e.g., A Spatial Light Modulator (SLM) assembly under the control of a computer).

In the case of the present invention, the system has been modified to include the slit SL formed in diaphragm DI above mask TM, and the pattern image formed by the pixel units can be shifted as described herein for projection of the desired patterns through the fixed position mask TM and fixed position slit SL in fixed position diaphragm DI. The shift of the image which moves across the slit SL in diaphragm DI is synchronized with the movement of the workpiece W, i.e. a semiconductor wafer. This invention shows a "mask image scanning" exposure system.

This invention uses only the slit SL in the middle of the diaphragm DI, so therefore the image also forms only in the lens middle slit SL area (thereby providing better lens performance since normally the four corners of an exposed area require deflections which induce large degrees of distortion.)

By varying the data-Base file the scanning system of this invention using the mask TM can form device layer patterns repeatedly. Therefore, it increases the field size (not limited by the mask size) which means that with one shot, more dies can be exposed. In addition, the scan can be prolonged as long as possible in the scanning direction since the scanning optics are fixed in position and only the image presented to the slit SL and the workpiece are moving so the peripheral region of the optical system are not involved in the projection of the image.

FIG. 3A shows an overall pattern PAT, a portion of which will appears above the mask slit SL shown in FIG. 3B at time t1. FIG. 3B shows a slit SL in the diaphragm DI which provides a narrow, scannable, exposure pattern. Actually mask slit SL lies below the area marked by dotted lines as t1. It should be noted that the mask pattern PAT is shifting to the right in synchronization with wafer movement. The direction of the "Image Scanning Direction" of the image in the mask TM is indicated by arrow ISD.

FIGS. 4A, 4C and 4E show the image in the mask TM at times t1, t2 and t3 respectively of the mask TM with the pattern seen in FIG. 3A with the pattern which exists in mask TM at time t1. The shifting of the pattern appearing on the mask TM is seen when looking at FIGS. 4C and 4E which show the image in the mask TM at times t2 and t3 respectively and comparing those image to the image at time t1 in FIG. 4A. FIG. 4A shows the image pattern which appears in the mask slit at time t1; and FIG. 4B shows the pattern projected upon a semiconductor wafer WA at time t1 as the wafer WA begins to move from the right to the left. The image scanning direction of the images projected through the slit SL is from left to right.

FIG. 4C shows the image pattern which appears in the mask slit at time t2 and FIG. 4D shows the pattern projected upon a semiconductor wafer WA at time t2, as the wafer WA moves along from the right to the left.

FIG. 4E shows the image pattern which appears in the mask slit at time t3 and FIG. 4F shows the pattern projected upon a semiconductor wafer WA at time t3 as the wafer WA moves along even farther from the right to the left.

FIG. 5A shows use of a conventional mask M in conventional stepper system with a lens L to expose a wafer image in one shot (for example a 4×16M DRAM). FIG. 5B shows a plan view of the result of the exposure upon the wafer WA.

FIG. 5C shows the use of a step and scan system with an aperture AP below the mask M which is scanning from left to right at the same time that the workpiece wafer WA is moving from right to left; and with the same lens L with one shot can expose more dies depending upon mask size as shown in FIG. 5D which shows a plan view of the result of the exposure upon the wafer WA with the system of FIG. 5C.

FIG. 5E shows the use of a system in accordance with this invention with a scan which distance can be prolonged to last for a much longer duration. There is no limit to the size of the mask since it is the Scanning Image SI which is scanning, not the mask.

FIG. 5F shows the multiple dies produced with the system and method of FIG. 5E.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the scope, i.e. purview, of the present invention and the invention encompasses the subject matter of the claims which follow.

Having thus described the invention, what is claimed as new and desirable to be secured by Letters Patent is as follows:

1. A dynamic mask exposure method comprising:
   providing an opaque diaphragm with a narrow slit therethrough,
   providing a support for scanning a workpiece in a forward direction across the narrow slit,
   providing a transmissive dynamic mask (TDM) comprising a spatial light modulator, having a top surface and a bottom surface and binary pixel units which are opaque or transparent as a function of control inputs on matrices of TDM actuator lines from a control system
   supplying pixel control signals to TDM actuator lines to form a pattern of transparent and opaque regions in the TDM,
   scanning the pixel control signals across the TDM in a reverse direction to provide an effective scan of an image electronically across the pixel units of the TDM simultaneously with the scanning of the workpiece which is being scanned in the reverse direction synchronously with the effective scan of the image,
   directing a beam onto the top surface from a beam source,
   passing the beam through transparent pixel units in the TDM and projecting a pattern through the TDM towards the support by projecting radiation from the beam through the narrow slit which is positioned between the beam source and the workpiece.

2. The method of claim 1 wherein the control system includes a computer and a direct access storage device for storing patterning data.

3. The method of claim 1 wherein the beam source of exposure radiation comprises a collimated light beam.

4. The method of claim 1 wherein the beam source is a collimated light beam provided by a set of condenser lenses projecting the collimated light beam onto the top surface.

5. The method of claim 1 wherein:
   the beam source of exposure radiation comprises a collimated light beam provided by a set of condenser lenses projecting the collimated light beam onto the top surface of the TDM, and
   a set of lenses project and focus the pattern from the TDM onto the support from the bottom surface of the TDM.

6. The method of claim 5 wherein the control system includes a computer and a direct access storage device for storing patterning data.

7. A dynamic mask exposure method comprising:
   providing a beam source,
   providing an opaque diaphragm with a narrow optical slit therethrough,
   providing a support for scanning a workpiece in a given direction across the narrow optical slit,
   providing a transmissive spatial light modulator (TSLM) having a top and a bottom and binary pixel units which are opaque or transparent in response to signals from a control system which supplies pixel control signals to a matrix of actuator lines to form a pattern,
   scanning the pixel control signals across the TSLM in an opposite direction providing an effective electronic scan of an image across pixel units of the TSLM simultaneously with the scanning of the workpiece which is being scanned synchronously with the effective scan of the image,
   directing a beam onto the top of the TSLM from a source,
   passing the beam through the pixel units of the TSLM which are currently transparent and projecting a pattern of light passing through the TSLM towards the support with the beam also passing through the narrow, optical slit located between the source and the support.

8. A dynamic mask exposure method comprising:
   providing an opaque diaphragm with a narrow, transparent slit, providing a workpiece support for scanning a workpiece in a first direction transverse to the slit,
   providing a control system including a computer and a direct access storage device for storing patterning data,
   providing a transmissive spatial light modulatar (TSLM), having a top and a bottom, and binary pixel units which are opaque or transparent as a function of control inputs to orthogonally arranged matrices of actuator lines of the TSLM from said control system,
   supplying pixel control signals to the actuator lines of the TSLM to form a pattern of transparent and opaque regions in the TSLM, scanning the pixel control signals across the TSLM in a direction opposite from the first direction to provide an effective scan of an image electronically across the pixel units of the TSLM simultaneously with the scanning of the workpiece which is being scanned in the opposite direction synchronously with the effective scan of the image,
   providing a source of a collimated light beam directed onto the top, the collimated light beam being provided by a set of condenser lenses projecting the collimated light beam thereon, and passing the collimated light beam through a dynamic pattern determined by the pixel units which are transparent, of the TSLM, and projecting light in the dynamic pattern through the TSLM towards the support where the workpiece is to be located, with the collimated light beam passing through the narrow, transparent, slit positioned between the source of the collimated light beam and the workpiece.

* * * * *